United States Patent [19]

Bremer

[11] 3,761,840

[45] Sept. 25, 1973

[54] VOLTAGE CONTROLLABLE CRYSTAL DIGITAL CLOCK

[75] Inventor: Gordon F. Bremer, St. Petersburg, Fla.

[73] Assignee: Honeywell Information Systems Inc., Waltham, Mass.

[22] Filed: July 21, 1972

[21] Appl. No.: 274,117

[52] U.S. Cl. .......................... 331/116 R, 331/177 V
[51] Int. Cl. .............................................. H03b 5/36
[58] Field of Search ............. 331/116 R, 159, 177 V

[56] References Cited

UNITED STATES PATENTS 3,026,487 3/1962 Walsh et al. .................... 331/116 R
3,227,968 1/1966 Brounley..................... 331/177 V X

*Primary Examiner*—Roy Lake
*Assistant Examiner*—Siegfried H. Grimm
*Attorney*—Nicholas Prasinos

[57] ABSTRACT

A TTL (transistor-transistor-logic) compatible voltage controllable crystal digital clock having a relatively wide linear frequency control range with relatively small control voltage range. A quartz crystal in series with a voltage variable reactance is coupled in a regenerative loop of an oscillator circuit. A control voltage varies the capacitance of the voltage variable reactance resulting in a phase shift around the regenerative loop and changing the frequency of oscillation of the circuit.

9 Claims, 2 Drawing Figures

PATENTED SEP 25 1973

3,761,840

VOLTAGE CONTROLLABLE CRYSTAL DIGITAL CLOCK

The invention herein described was made in the course of or under a contract or subcontract thereunder with the United States Government.

BACKGROUND OF THE INVENTION

1. Field of the Invention

This invention relates generally to frequency stabilized crystal digital clocks and more particularly to voltage controlable crystal digital clocks which are TTL (transistor-transistor-logic) compatible.

2. Description of the Prior Art

There are a number of existing digital clocks and/or oscillator circuits, and a good number of these circuits are crystal controlled. Quartz crystals have been used to stablize oscillator circuits for a long time, because they exhibit a natural frequency of oscillation which can be accurately sustained when the crystal is subjected to an electric oscillatory signal of the proper phase. Typical of such prior art crystal controlled oscillators are the devices to be found in the following issued U.S. Pat.:

1. Crystal-Controlled Transistor Oscillator by S.K. Benjamin et al., No. 2,946,018 issued July 19, 1960;
2. Stabilized Transistor Oscillator by R. A. Hilbourne, No. 2,980,865 issued Apr. 18, 1961;
3. Crystal Controlled Transistor Oscillator, by S. Bernfeld et al., No. 3,179,902 issued Apr. 20, 1965;
4. Transistor Oscillator, by E. G. Miller, No. 2,797,328 issued June 25, 1957.

In the Benjamin device, the oscillatory portion of the circuit "includes a closed loop containing two transistors and a crystal. The output of one transistor is connected to the input of the other transistor, and its output is connected back through the crystal to the input of the first transistor, forming a closed loop." The device operates in the inductive mode to insure operation at only a single frequency. Its frequency range is limited to operation in the kilocycle frequency range.

The Hilbourne device comprises in part, "a bimorph piezoelectric crystal connected between the input and output terminals of the amplifier for establishing a regenerative, feedback loop, the signal gain around the feedback loop being adequate to cause an oscillatory sinusoidal signal voltage to be generated therein substantially at the resonant frequency of the crystal. The oscillator additionally comprises voltage limiting means connected to the output terminals of the amplifier, such means being adapted to prevent the voltage across those terminals from falling below a substantially constant level exceeding that corresponding to saturation of any of the transistors."

Although such prior art devices provide relatively stable oscillators, they produce essentially sine wave outputs, and are nonetheless subject to some instability in frequency due to variation in the natural frequency of oscillation of the quartz crystal with variations in temperature, power supply voltages, and other factors. In order to obtain greater stability for such oscillators, complicated compensating circuitry has generally been utilized, or specially designed circuits for given frequency ranges is resorted to, and/or the quartz crystal is placed in specially designed constant temperature chambers. All of these approaches further complicate the crystal oscillator circuitry and in view of many modern day requirements such as for example, digital outputs for use as a computer clock, TTL compatibility for use in computers and modems, and voltage controllable frequency features for use in phase-lock loops it becomes more and more difficult if not impossible to analyze and design circuits of crystal controlled oscillators which are substantially predictable in operation and practice, and results in relatively expensive circuits being made more expensive by resort to trial and error design techniques.

SUMMARY OF THE INVENTION

The instant invention meets modern day requirements, by a relatively simple stable circuit that generates a digital or rectangular square wave output, is TTL compatible, has a larger control range for controlling frequency than many prior art devices, permits power supply voltage variation of substantially ±10 percent, and facilitates circuit analysis, design and choice of circuit components for different applications.

Essentially, two transistors operate as a voltage comparator for comparing voltage signals applied at their bases. A quartz crystal in series with a voltage variable reactance device is coupled in a series-resonant regenerative loop from the collector of one transistor and to the base of another and operates in the inductive mode resulting in a low impedance at the nominal resonant frequency of the crystal to provide positive feedback, and sustained oscillations at the nominal resonant frequency of the crystal. By varying the capacitance of the voltage variable reactance device, which may be a varactor or varicap, by the application of a control voltage, a phase shift results around the regenerative loop causing a change in the frequency of oscillation of the circuit.

OBJECTS

It is an object therefore of the invention to produce an improved voltage controllable crystal oscillator.

It is another object of the invention to produce a voltage controllable crystal oscillator having a relatively wide linear frequency control range with relatively small control voltage range.

It is still another object of the invention to produce a voltage controllable crystal oscillator which is TTL compatible.

Yet another object of the invention is to produce a voltage controllable crystal oscillator which is relatively simple to analyze and design and more predictable in operation and practice.

These and other objects of the invention will become manifest from reading the following detailed description in connection with the drawings contained herewith.

DESCRIPTION OF THE INVENTION

Figure 1:
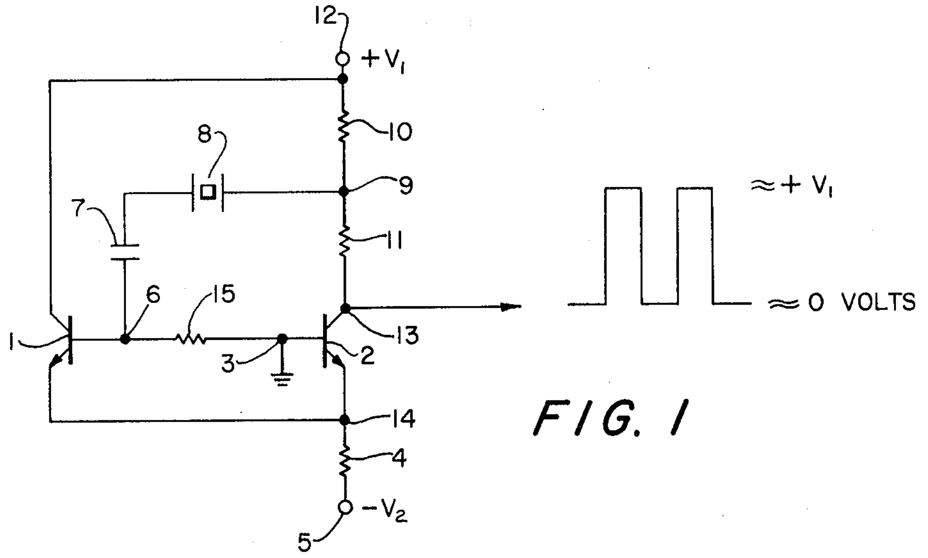
FIG. 1 is an equivalent circuit diagram of one embodiment of the invention.

Referring now to FIG. 1 two transistors 1 and 2 have their bases coupled to each other through resistor 15 and their emitters coupled to each other at junction point 14. Negative DC supply voltage terminal 5 is coupled to junction point 14 through resistor 4. Positive DC supply voltage terminal 12 is coupled directly to the collector of transistor 1 and is coupled to the collector of transistor 2 through series resistors 10 and 11. A quartz crystal 8 in series with a capacitor 7 is coupled to the base of transistor 1 at junction point 6 and to the collector of transistor 2 at junction point 9 through resistor 11. A rectangular shape voltage output is abstracted from the collector of transistor 2 at junction point 13.

In operation a positive DC voltage $+V_1$ (which may be 2.5 volts or greater) is applied at terminal 12 whereas a negative DC voltage $V_2$ (which may be below 3 volts) is applied at terminal 5. During operation of the digital clock, the current through resistor 4 is held essentially constant since junction point 3 is at ground potential and resistor 15 is chosen to have a relatively small value. The bases of both transistor 1 and transistor 2 are therefore essentially at ground potential. As a consequence, since the transistors are used in an active region, the common emitter point 14 of transistors 1 and 2 is also at a constant DC potential. Therefore, since $V_2$ is constant, the current through resistor 4 is also constant. During operation this constant current is switched from transistor 1 to transistor 2. When the voltages $+V_1$ and $-V_2$ are initially applied, this constant current through resistor 4 is shared equally by transistor 1 and transistor 2, thus the collector current of transistor 1 is equal to the collector current of transistor 2 and the sum of these currents is equal to the current through resistor 4. Resistors 10 and 11 are of such magnitude so that during the initial state of operation, junction point 13 is at a potential which is between ground and $+V_1$ in order that transistor 2 operate in the active region. Once initial state has been achieved, any perturbation of the voltage at junction point 9 at a frequency close to the resonant frequency of crystal 8 will be transferred to junction point 6 through crystal 8 and capacitor 7. Crystal 8 is used in an inductive mode, and the series resonant circuit comprising the crystal 8 and capacitor 7 results in a low impedance path at the nominal resonant frequency of the crystal; therefore, for example, if the voltage at junction point 9 were to perturbate in a positive direction, this voltage would be transferred through the crystal 8 and capacitor 7 to junction point 6, thus increasing the voltage at junction point 6 and causing more current to be drawn through the collector of transistor 1. As discussed supra, the current through resistor 4 is constant; consequently the increase in collector current of transistor 1 results in a decrease of collector current of transistor 2, which in turn causes the voltage at junction point 9 to be driven more positive. Junction point 9 will be driven positive until it reaches $+V_1$ volts whereupon it can go no higher. The series resonant circuit of crystal 8 and capacitor 7 then attempts to produce a damped sinusoid at its nominal resonant frequency at junction point 6 causing the voltage at junction point 6 to begin in a downward or negative direction. This action causes a reduction in the current through transistor 1 and an increase in the current through transistor 2. Therefore, junction point 9 begins to become more negative until the regenerative cycle is completed. Because the crystal 8 is in a inductive mode and the series resonant circuit provides the low impedance required by this regenerative feedback only at its nominal resonant frequency, the oscillator circuit will oscillate only at the frequency of the crystal producing a substantially stable rectangular voltage output at the collector of transistor 2. Resistors 10 and 11 are chosen so that the ratio of their magnitudes provides a proper amount of positive feedback around the feedback loop and also to produce an output voltage which is compatible with a TTL device.

Figure 2:
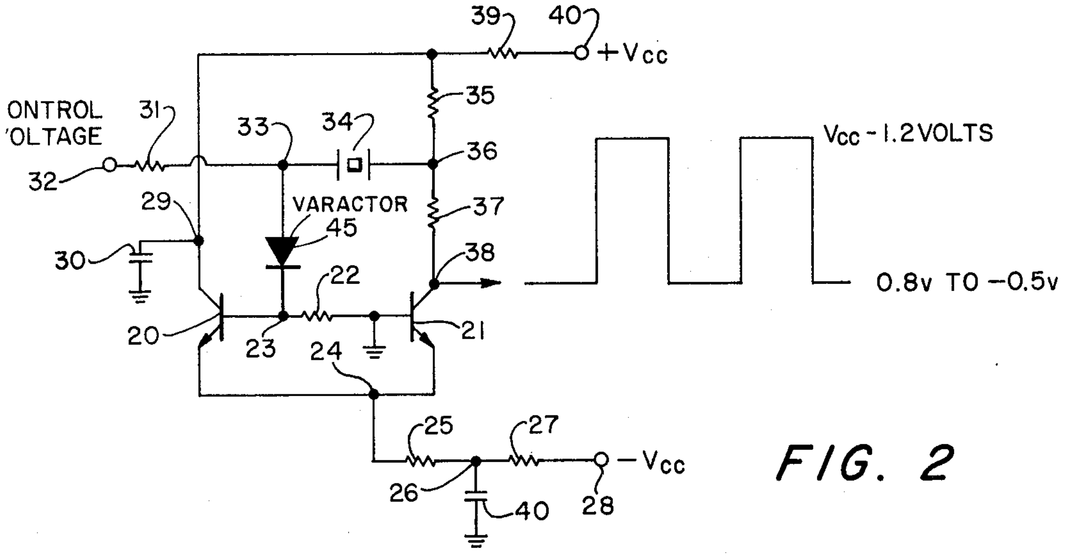
FIG. 2 is an equivalent circuit diagram of a preferred embodiment of the invention.

Referring now to FIG. 2, there is shown an embodiment of the invention whose operating principle is similar to that of FIG. 1 but includes added features in that the embodiment of FIG. 2 has a controllable frequency of oscillation and also has power supply noise supression. The bases of transistor 20 and 21 are coupled to each other through a resistor 22 whereas the emitters of transistors 20 and 21 are coupled to each other at common emitter point 24. An essentially constant −DC current is applied to the emitters of transistors 20 and 21 at common emitter point 24 through −DC voltage supply terminal 28 and through resistors 25 and 27. Positive DC voltage ($+V_{cc}$) is applied to the collector of transistor 20 through positive DC voltage supply terminal 40 and resistor 39, whereas this positive DC voltage is applied to the collector of transistor 21 through voltage terminal 40 and series resistors 39, 35, and 37 respectively. A capacitor 30 coupled to ground and to the collector of transistor 20 at junction point 29 provides together with resistor 39 power supply noise suppression from noise sources injected at voltage terminal 40 whereas capacitor 40 coupled to ground and to junction point 26 together with resistors 25 and 27 provides power supply noise suppression from noise injected at voltage terminal 28. A quartz crystal 34 in series with a voltage variable reactance 45 such as for example a varactor is coupled to the base of transistor 20 at junction point 23 and to the collector of transistor 21 at junction point 36 through resistor 37. Control voltage is applied to the varactor 45 through resistor 31. The digital voltage signal is abstracted at the collector of transistor 21 at junction point 38.

Table 1 below shows typical values of components and/or voltage supply.

TABLE 1

TYPICAL VALUES

| Name and Figure No. | Manufacturers Type | Value | Units |
|---|---|---|---|
| quartz crystal (34) | Cr 18/U | 2.3040 | MHz |
| varactor (45) | RN5140 | | |
| resistor (39) | | 82 | ohms |
| resistor (35) | | 300 | ohms |
| resistor (37) | | 120 | ohms |
| resistor (22) | | 1 | kilohm |
| resistor (31) | | | |
| resistor (25) | | 470 | ohms |
| resistor (27) | | 470 | ohms |
| capacitor (30) | | 0.1 | micro henries |
| capacitor (46) | | 0.1 | micro henries |
| supply voltage $+V_{cc}$ (28) | | 12 | volts |
| supply voltage $\pm V_{cc}$ (40) | | +5 | volts |

The embodiment of FIG. 2 operates in principle similar to the embodiment of FIG. 1 but in addition has a controllable frequency of oscillation and power supply noise supression. By applying a control voltage at terminal 32, through resistor 31 to voltage variable reactance 45 (in this case a varactor although other voltage variable reactances may be used) the capacitance of the varactor 45 is varied. Variations of the capacitance of the varactor 45 in turn cause a phase shift around the regenerative feedback loop, which in turn changes the frequency of oscillation of the circuit until the phase of the crystal itself becomes complementary to the change of the capacitor.

Having shown and described two embodiments of the invention, those skilled in the art will realize that many variations and modifications can be made to produce the described invention and still be within the spirit and scope of the claimed invention.

What is claimed is:

1. A crystal controlled digital clock for generating essentially rectangular voltage signals comprising:

a. at least two transistors having their bases coupled to each other via a first resistor with the base of one transistor also being coupled to ground potential and the base of the other transistor being coupled to ground via said first resistor, said transistors also having their emitters coupled to each other;

b. a series-coupled quartz crystal and capacitor circuit coupled to the collector of said one transistor via a second resistor and also coupled directly to the base of said other transistor and to the base of said one transistor via the first resistor;

c. first voltage supply means for supplying a first DC voltage of a first polarity to the emitters of said transistors via a third resistor and second DC voltage supply means for supplying a second voltage of a second polarity to the collector of said other transistor directly and to the collector of said one transistor via said second and a fourth resistor and further supplying said second voltage to the base of said transistor via said fourth resistor and said series-coupled quartz crystal and capacitor circuit and to the base of said one transistor via said fourth resistor, said series-coupled quartz crystal and capacitor circuit and said first resistor: and d. means for abstracting the generated rectangular voltage signal.

2. A crystal controlled digital clock as recited in claim 1 wherein said capacitor is a voltage variable reactance means and including control voltage supply means coupled to said voltage variable reactance means for supplying a control voltage to said voltage variable reactance means, said voltage variable reactance means responsive to the control voltage for varying the capacitance of said voltage variable reactance whereby the frequency of oscillation of said digital clock is varied.

3. A crystal controlled digital clock as recited in claim 2 wherein the values of said second and fourth resistors have a predetermined ratio to each other for initially maintaining said one transistor in an active region.

4. A crystal controlled clock as recited in claim 3 wherein said series-coupled quartz crystal and capacitor circuit operates in a series-resonant mode and said voltage variable reactance means is a varactor.

5. A crystal controlled digital clock as recited in claim 4 for generating essentially rectangular voltage signals further comprising:

a. power supply noise suppression means coupled to the collector and emitter circuits of said transistors.

6. A voltage controllable crystal digital clock comprising:

a. a first transistor coupled to a series resonant circuit comprised of a first resistor having a first and second resistor-terminal, a quartz crystal having a first and second crystal-terminal, and a capacitor having a first and second capacitor-terminal, said first resistor-terminal coupled to said first crystal-terminal, said second crystal-terminal coupled to said first capacitor-terminal and said second capacitor-terminal coupled to the base of said first transistor, said series resonant circuit being coupled between the collector and base of said first transistor, said capacitor being a voltage variable reactance means responsive to a control voltage for varying the capacitance of said voltage variable reactance and hence varying the frequency of oscillation of said digital clock;

b. a switching circuit comprising a second transistor with its collector coupled to the first crystal-terminal of the quartz crystal of said series resonant circuit via a second resistor, with its base coupled to the second capacitor-terminal of the capacitor of said series resonant circuit via a third resistor, and with its emitter coupled to the emitter of said first transistor;

c. first voltage supply means coupled to the base of said first transistor and the second resistor-terminal of said first reistor, and second voltage supply means coupled to the emitters of said first and second transistors via a fourth resistor, said first and second voltage supply means for supplying a positive and negative potential to said first and second transistors; and, d. means coupled to said digital clock for abstracting the generated digital signal from said digital clock.

7. A voltage controllable digital clock as recited in claim 6 wherein said switching means is a quartz crystal operating in a series resonant mode at its nominal resonant frequency.

8. A voltage controllable digital clock as recited in claim 6 including power supply noise suppression means coupled to the collector and emitter circuits of said transistors.

9. A voltage controllable digital clock as recited in claim 8 wherein said power supply noise suppression means comprise resistors and capacitors.

* * * * *

UNITED STATES PATENT OFFICE
CERTIFICATE OF CORRECTION

Patent No. 3,761,840 Dated September 25, 1973

Inventor(s) Gordon F. Bremer

It is certified that error appears in the above-identified patent and that said Letters Patent are hereby corrected as shown below:

Column 6, line 49, after said, delete "switching means is a quartz crystal operating in a series resonant mode at its nominal resonant frequency" and substitute therefor --voltage variable reactance means is a varactor.

Signed and sealed this 25th day of December 1973.

(SEAL)
Attest:

EDWARD M.FLETCHER,JR.
Attesting Officer

RENE D. TEGTMEYER
Acting Commissioner of Patents